(12) United States Patent
Hirata et al.

(10) Patent No.: US 10,957,636 B2
(45) Date of Patent: Mar. 23, 2021

(54) SEMICONDUCTOR DEVICE

(71) Applicant: Rohm Co., Ltd., Kyoto (JP)

(72) Inventors: Makoto Hirata, Kyoto (JP); Shingo Matsumaru, Kyoto (JP); Satoru Nate, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/588,463

(22) Filed: Sep. 30, 2019

(65) Prior Publication Data
US 2020/0365496 A1    Nov. 19, 2020

(30) Foreign Application Priority Data

May 14, 2019 (JP) .............................. JP2019-091182

(51) Int. Cl.
*H01L 23/495* (2006.01)
*H01L 23/31* (2006.01)
*H01L 23/00* (2006.01)
*H01L 25/16* (2006.01)

(52) U.S. Cl.
CPC .... *H01L 23/49575* (2013.01); *H01L 23/3107* (2013.01); *H01L 23/49562* (2013.01); *H01L 24/09* (2013.01); *H01L 24/48* (2013.01); *H01L 25/16* (2013.01); *H01L 2224/48091* (2013.01); *H01L 2224/48247* (2013.01)

(58) Field of Classification Search
CPC ... H01L 23/49575; H01L 24/09; H01L 24/48; H01L 25/16; H01L 23/49562; H01L 23/3107; H01L 2224/48247; H01L 2224/48091
See application file for complete search history.

(56) References Cited

U.S. PATENT DOCUMENTS 7,109,577 B2 *  9/2006  Shiraishi ........... H01L 23/49562
                                              257/690
2004/0169262 A1 *  9/2004  Oliver ............... H01L 23/49575
                                              257/676

(Continued)

FOREIGN PATENT DOCUMENTS

JP            2017-5165 A       1/2017

OTHER PUBLICATIONS

U.S. Appl. No. 29/707,990, filed Oct. 2, 2019.

*Primary Examiner* — Victor A Mandala
(74) *Attorney, Agent, or Firm* — Hamre, Schumann, Mueller & Larson, P.C.

(57) ABSTRACT

A semiconductor device includes leads, a switching element, a control element that controls the switching element, and a resin member covering the switching element, the control element and parts of the respective leads. The leads include a drain lead connected to a drain electrode of the switching element, a source lead connected to a source electrode of the switching element, and at least one control lead connected to the control element. The resin member includes a drain exposed portion at which the drain lead is exposed, a source exposed portion at which the source lead is exposed, and a control exposed portion at which the control lead is exposed. The distance in a first direction between the drain exposed portion and the source exposed portion is larger than the distance in the first direction between the control exposed portion and the source exposed portion.

16 Claims, 15 Drawing Sheets

(56) References Cited

U.S. PATENT DOCUMENTS

| | | | |
|---|---|---|---|
| 2005/0121777 A1* | 6/2005 | Hata | H01L 24/49 257/713 |
| 2009/0001535 A1* | 1/2009 | Heng | H01L 24/49 257/676 |
| 2012/0212870 A1* | 8/2012 | Necco | H02H 11/002 361/86 |
| 2014/0167822 A1* | 6/2014 | Rutter | H01L 23/4824 327/109 |
| 2014/0210061 A1* | 7/2014 | Otremba | H01L 24/97 257/676 |
| 2016/0211246 A1* | 7/2016 | Akiyama | H01L 21/8213 |
| 2017/0025337 A1* | 1/2017 | Padmanabhan | H01L 23/49531 |
| 2018/0160569 A1* | 6/2018 | Yoshihara | H01L 23/40 |
| 2018/0191260 A1* | 7/2018 | Kikuchi | H02M 1/4208 |
| 2018/0315684 A1* | 11/2018 | Sato | H01L 23/49513 |
| 2020/0066620 A1* | 2/2020 | Kanetake | H01L 23/3121 |

* cited by examiner

US 10,957,636 B2

SEMICONDUCTOR DEVICE

FIELD

The present disclosure relates to a semiconductor device.

BACKGROUND

JP-A-2017-5165 discloses a semiconductor device including a MOSFET as a switching element. In the semiconductor device disclosed in the above document, a plurality of leads for operating the switching element are exposed from a resin member in the same direction.

SUMMARY

There may be a demand for a semiconductor device including a switching element to be operable with high voltage. To be operable with high voltage, the semiconductor device often needs to be large.

In light of the foregoing circumstances, an object of the present disclosure is to provide a semiconductor device that is operable with high voltage and that is reduced in size.

According to an aspect of the present disclosure, there is provided a semiconductor device including: a plurality of leads; a switching element having a drain electrode, a source electrode and a gate electrode; a control element that controls the switching element; and a resin member that covers the switching element, the control element and a part of each of the plurality of leads. The plurality of leads include a drain lead electrically connected to the drain electrode, a source lead electrically connected to the source electrode, and at least one control lead electrically connected to the control element. The resin member includes a drain exposed portion at which the drain lead is exposed from the resin member, a source exposed portion at which the source lead is exposed from the resin member, and a control exposed portion at which the control lead is exposed from the resin member. The distance in a first direction between the drain exposed portion and the source exposed portion is larger than the distance in the first direction between the control exposed portion and the source exposed portion.

Other features and advantages of the present disclosure will become apparent from the detailed description given below with reference to the accompanying drawings.

DRAWINGS

DETAILED DESCRIPTION

Figure 1:
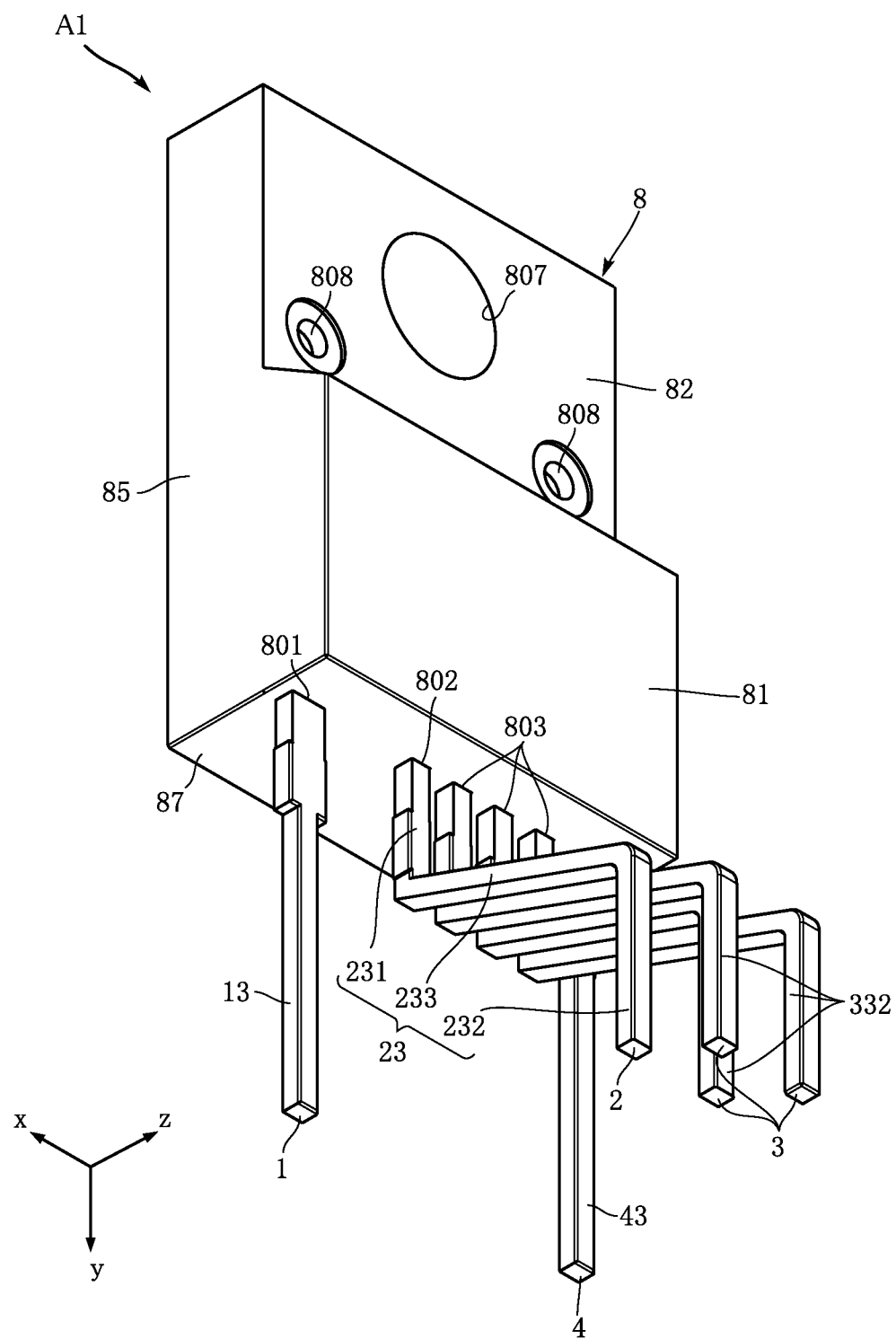
FIG. 1 is a perspective view showing a semiconductor device according to a first embodiment of the present disclosure.

The following describes preferred embodiments of the present disclosure with reference to the attached drawings.

Terms such as "first", "second", and "third" in the present disclosure are merely used as labels, and do not necessarily imply the sequence or order of the elements provided with the terms.

First Embodiment

FIGS. 1 to 15 show a semiconductor device according to a first embodiment of the present disclosure. A semiconductor device A1 of the present embodiment includes a plurality of leads 1, 2, 3, and 4, a switching element 5, a control element 6, an insulating layer 7, and a resin member 8. The semiconductor device A1 has a wide range of uses and performs various functions such as electric power conversion. For example, the semiconductor device A1 can be used as an AC/DC converter for industrial equipment. Such an AC/DC converter may convert an AC power of approximately 1200 V to a DC power of approximately 5 V.

Figure 2:
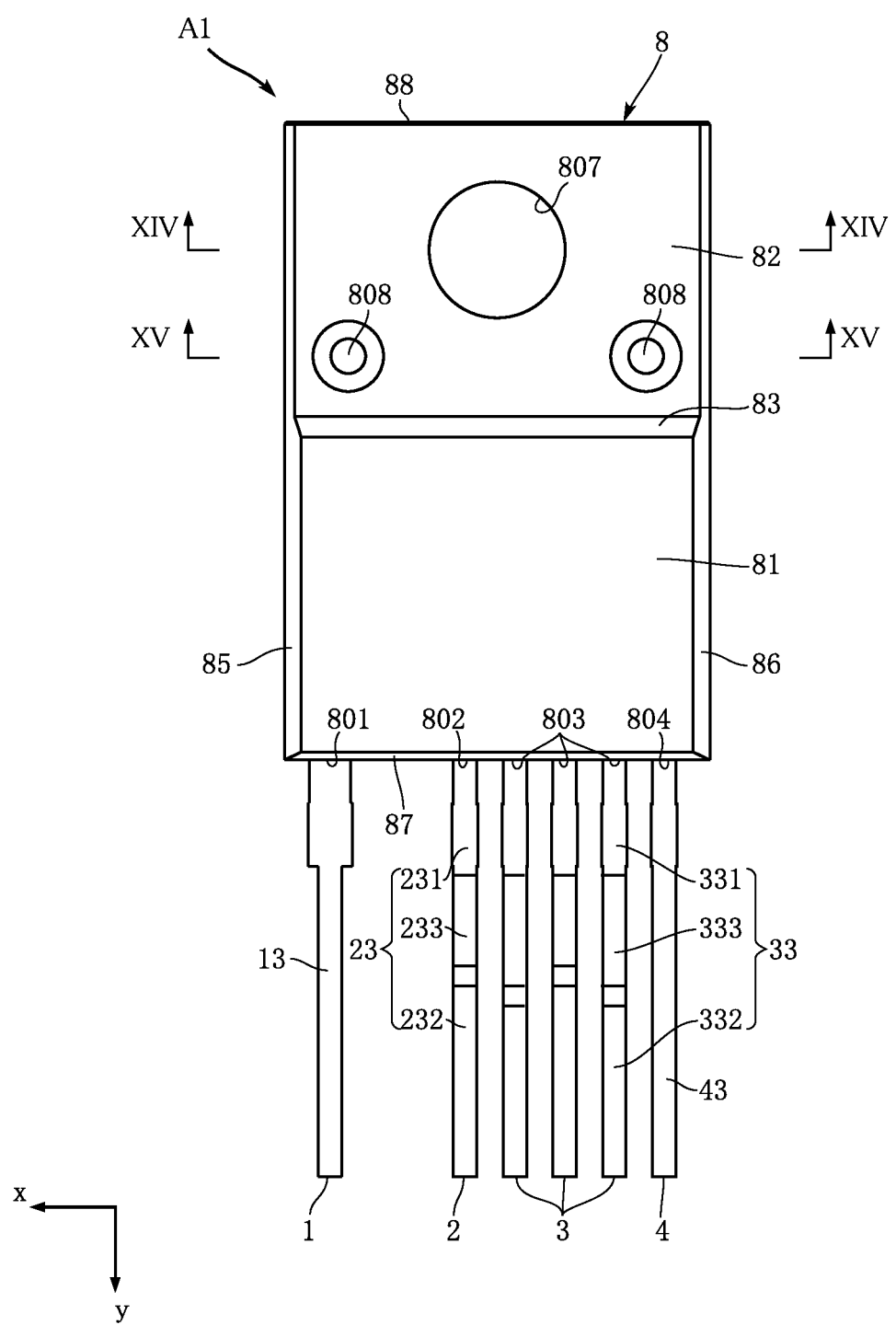
FIG. 2 is a front view showing the semiconductor device according to the first embodiment.
Figure 3:
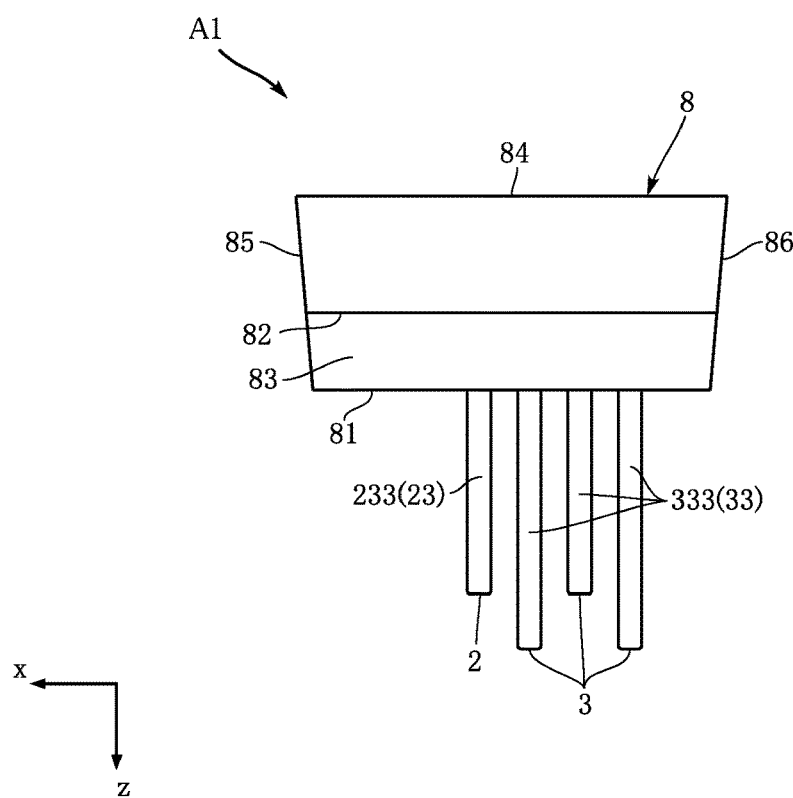
FIG. 3 is a plan view showing the semiconductor device according to the first embodiment.
Figure 4:
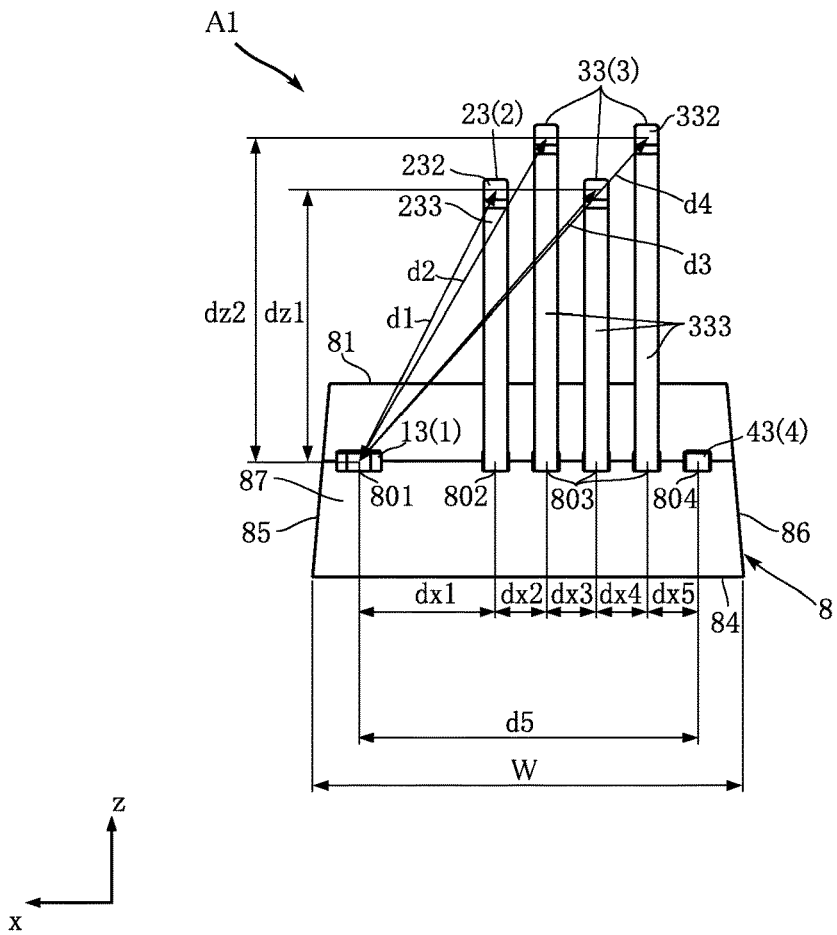
FIG. 4 is a bottom view showing the semiconductor device according to the first embodiment.
Figure 5:
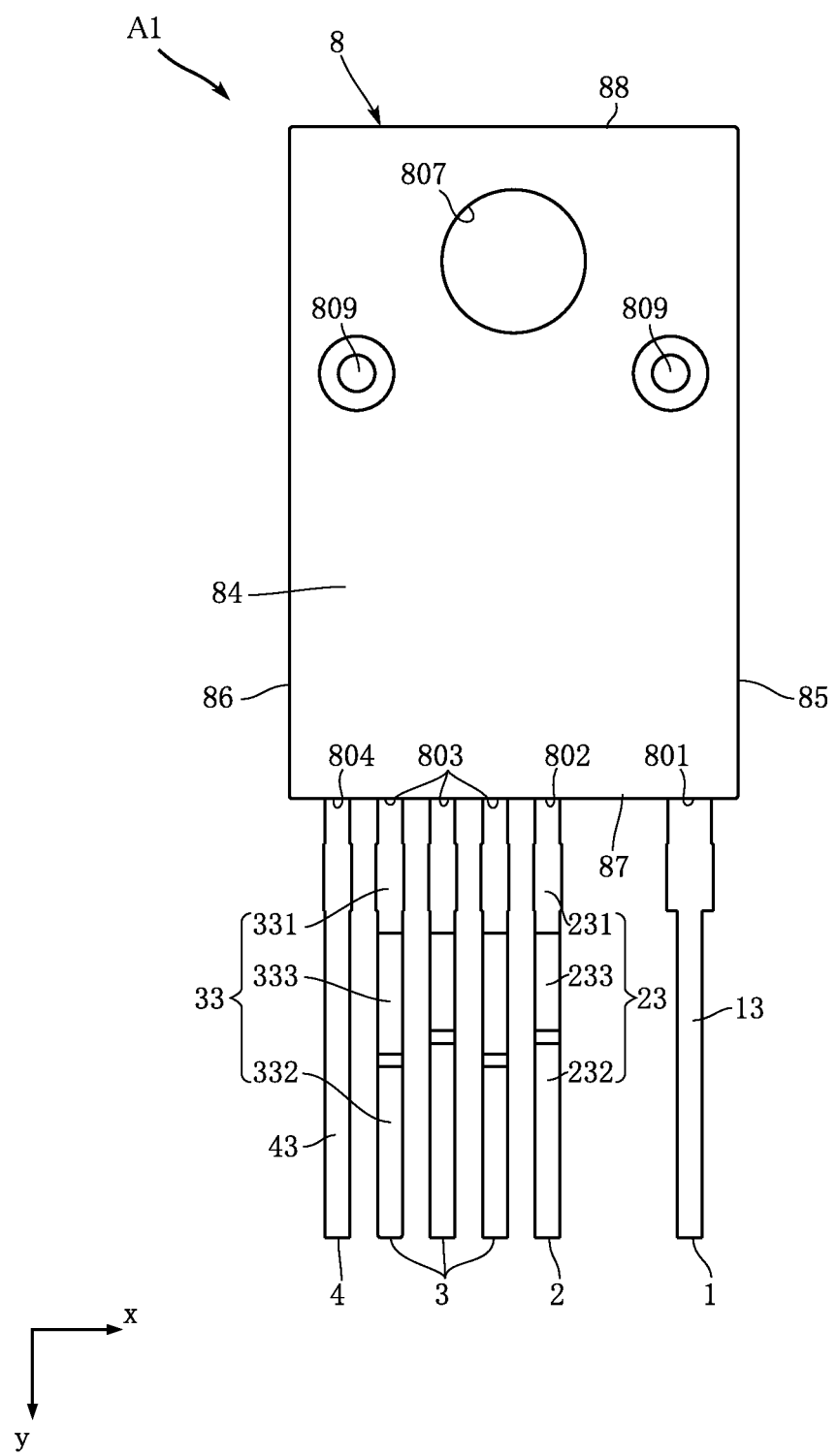
FIG. 5 is a back view showing the semiconductor device according to the first embodiment.
Figure 6:
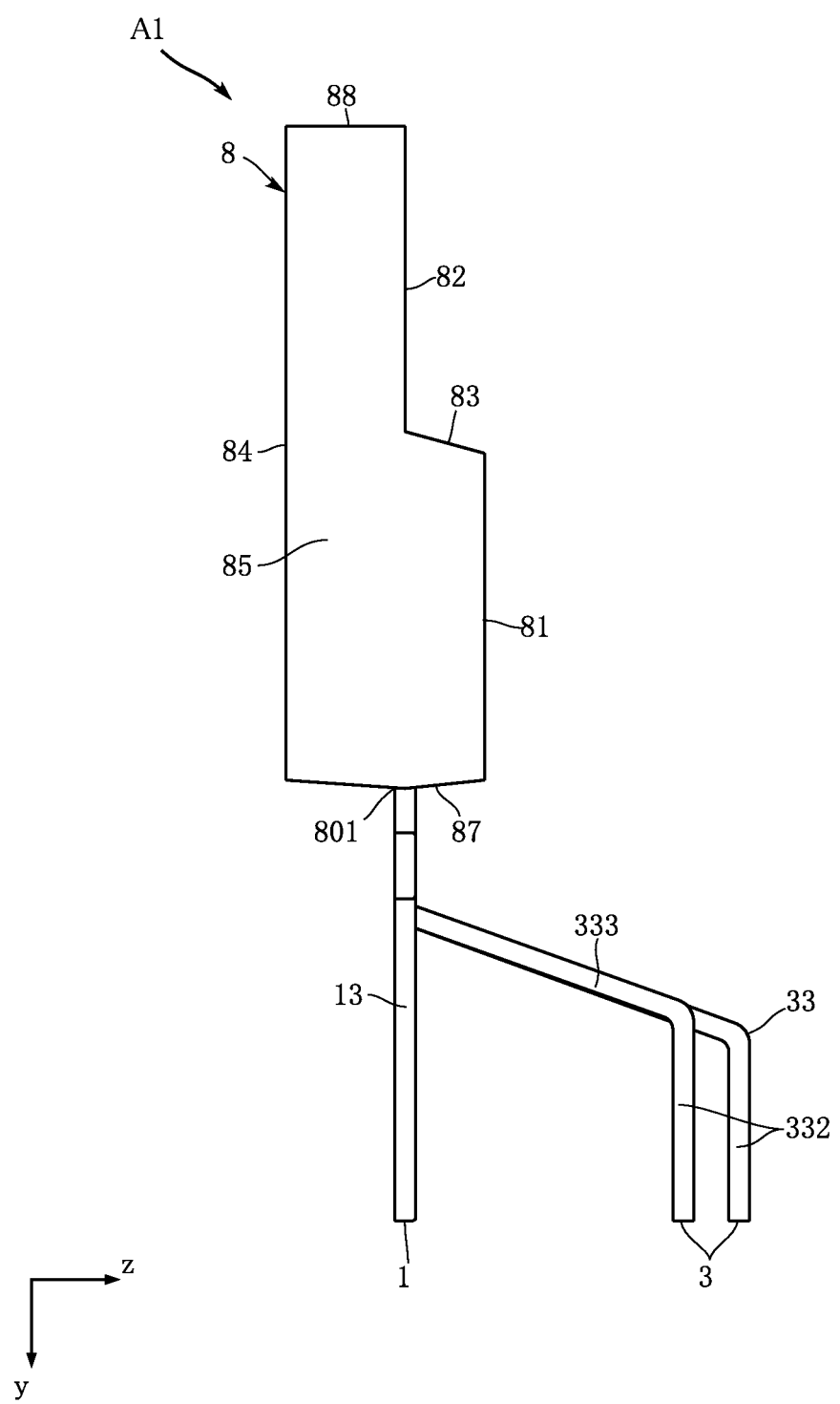
FIG. 6 is a left side view showing the semiconductor device according to the first embodiment.
Figure 7:
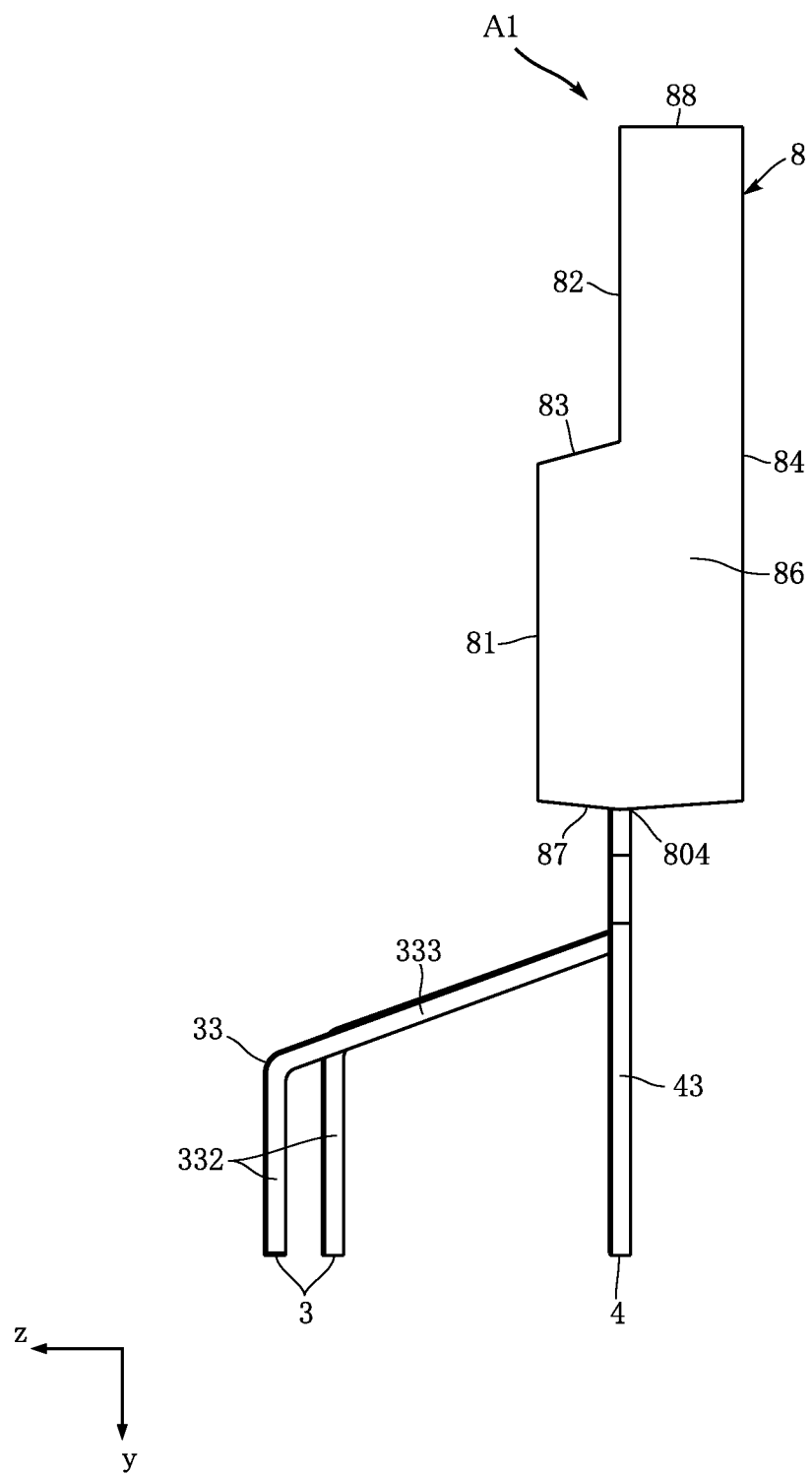
FIG. 7 is a right side view showing the semiconductor device according to the first embodiment.
Figure 8:
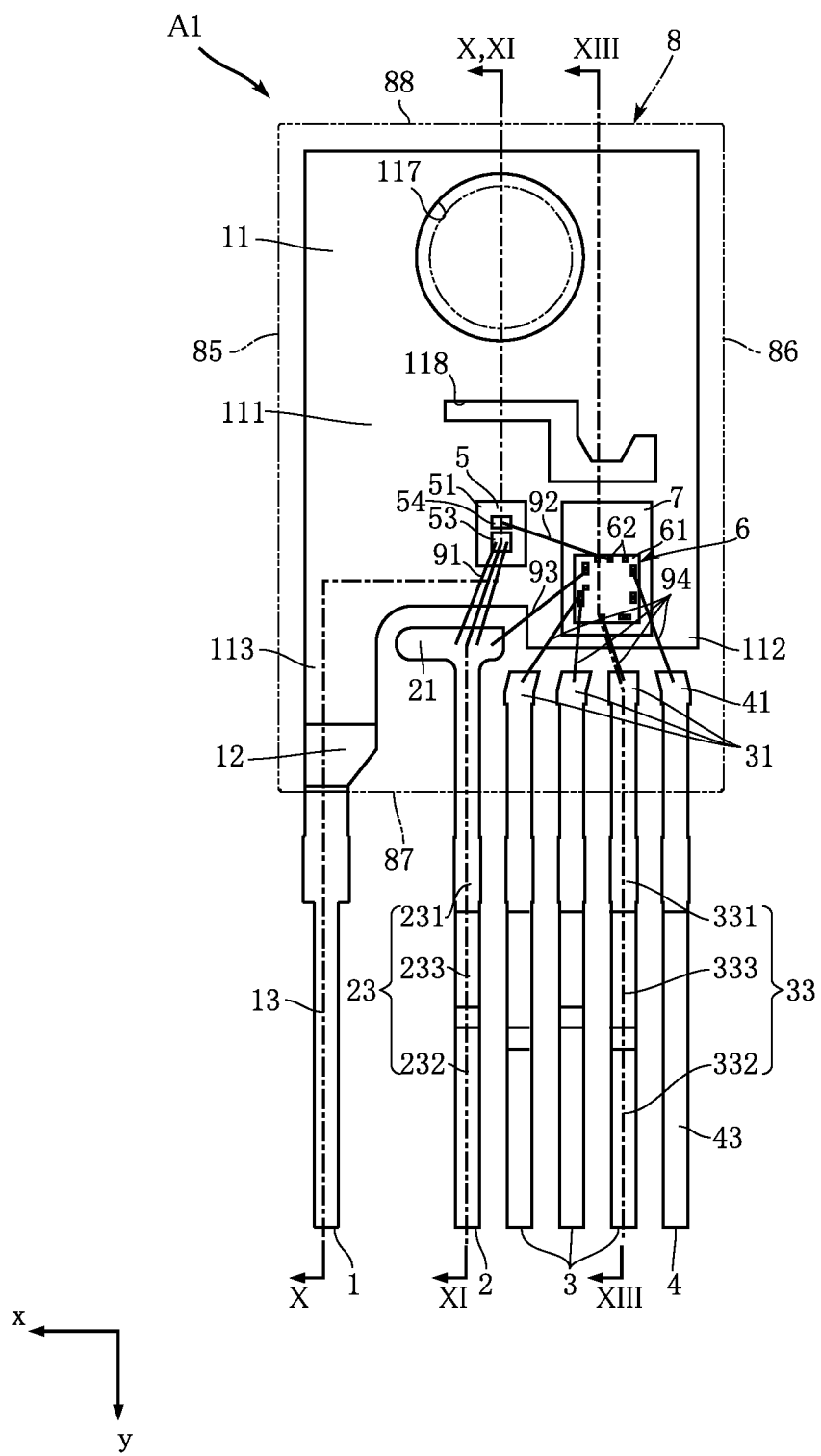
FIG. 8 is a main-part front view showing the semiconductor device according to the first embodiment.
Figure 9:
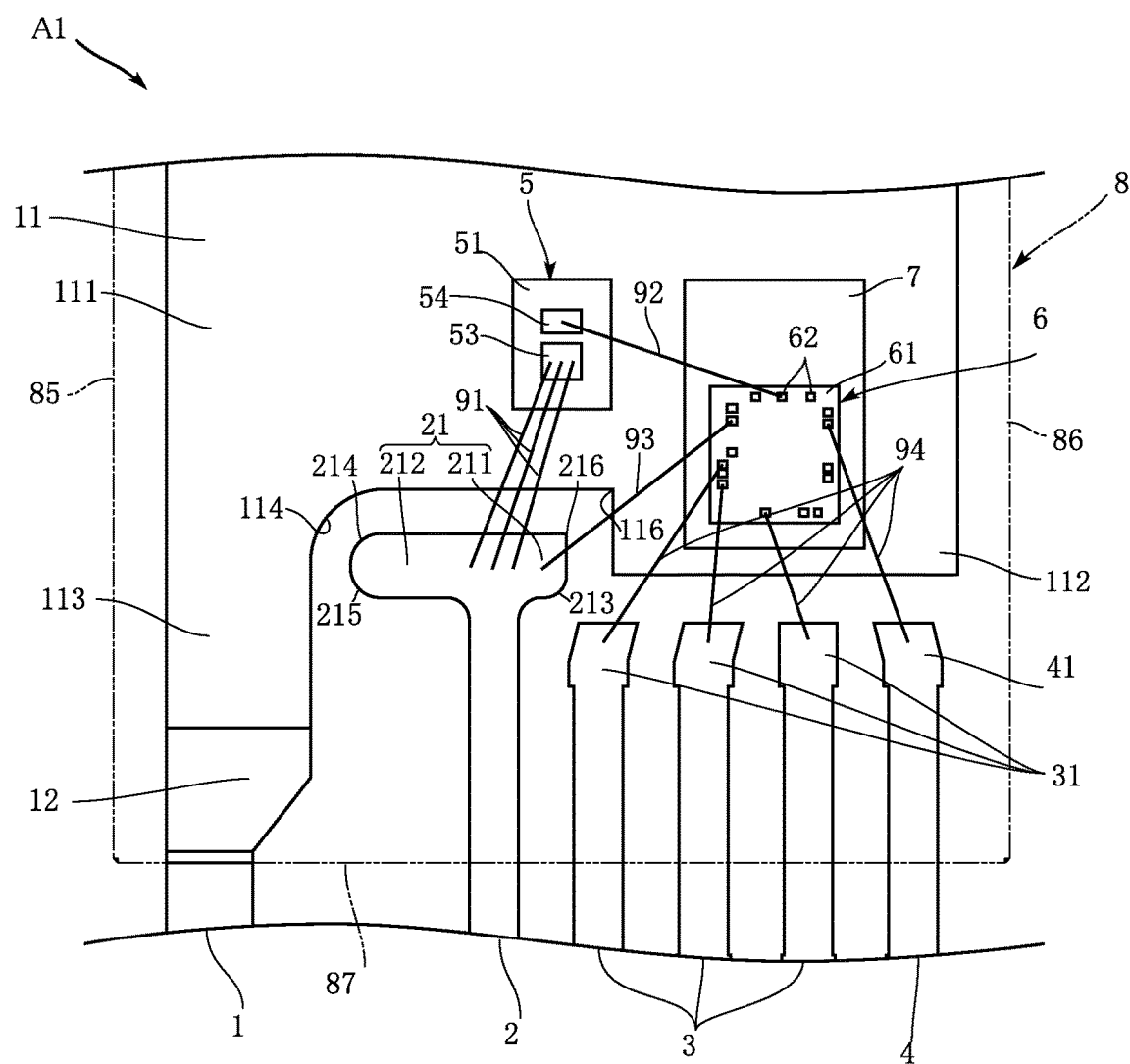
FIG. 9 is a main-part enlarged front view showing the semiconductor device according to the first embodiment.
Figure 10:
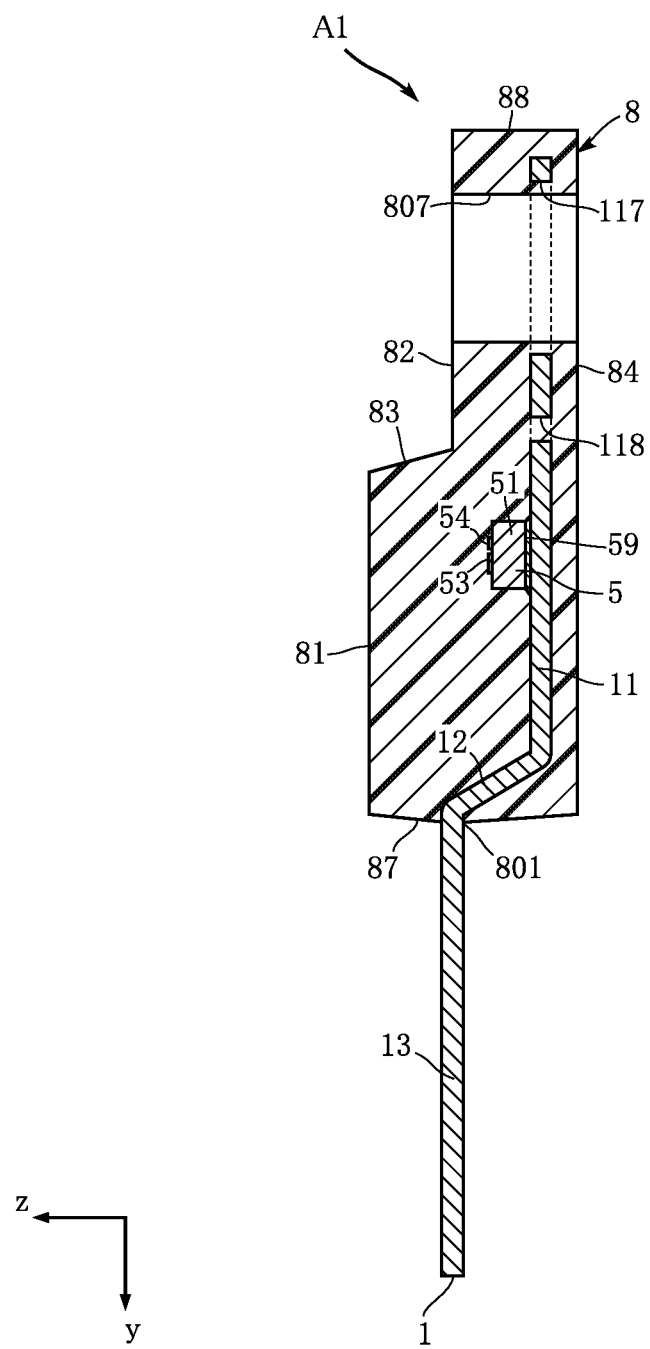
FIG. 10 is a cross-sectional view along line X-X of FIG. 8.
Figure 11:
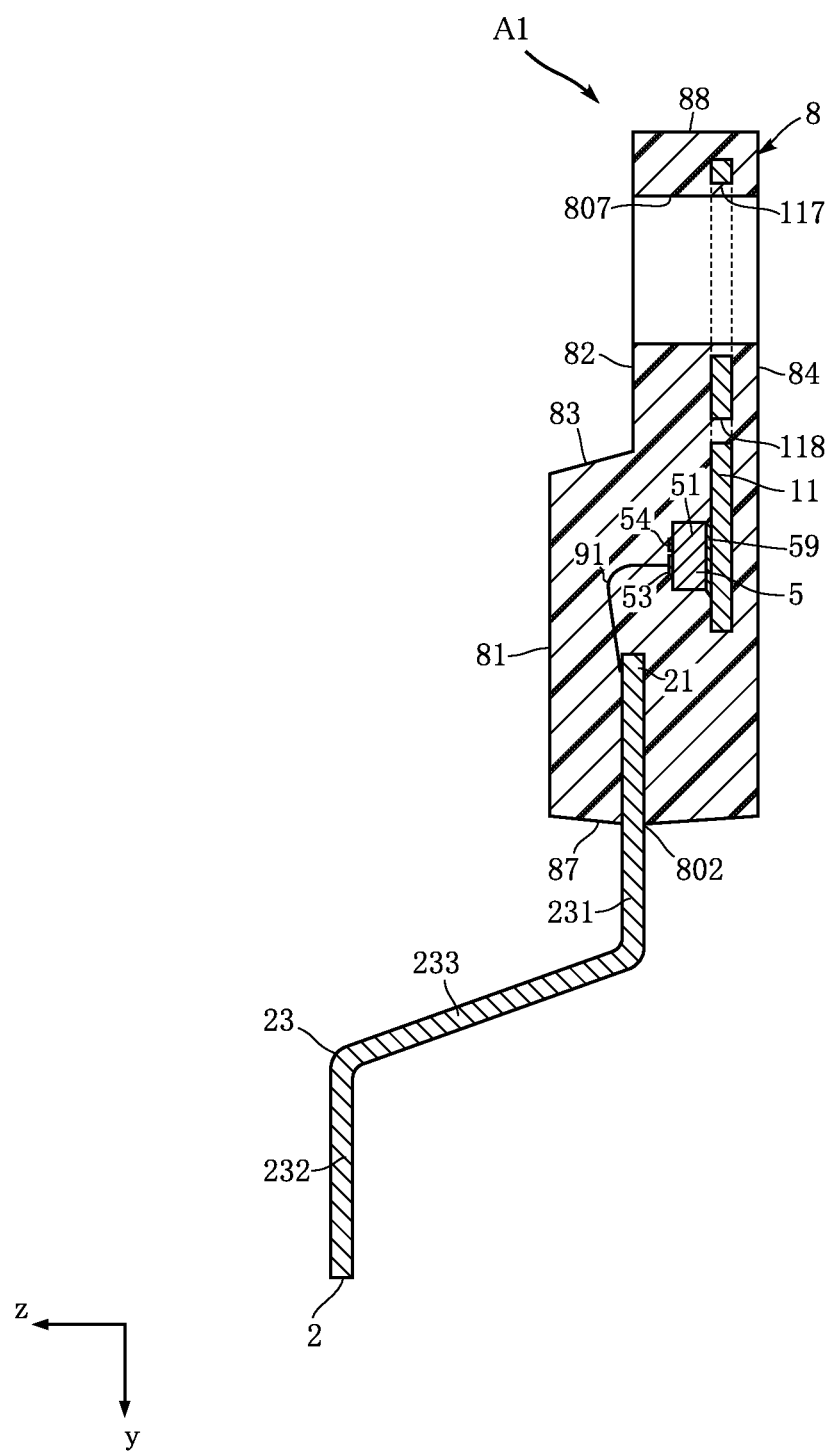
FIG. 11 is a cross-sectional view along line XI-XI of FIG. 8.
Figure 12:
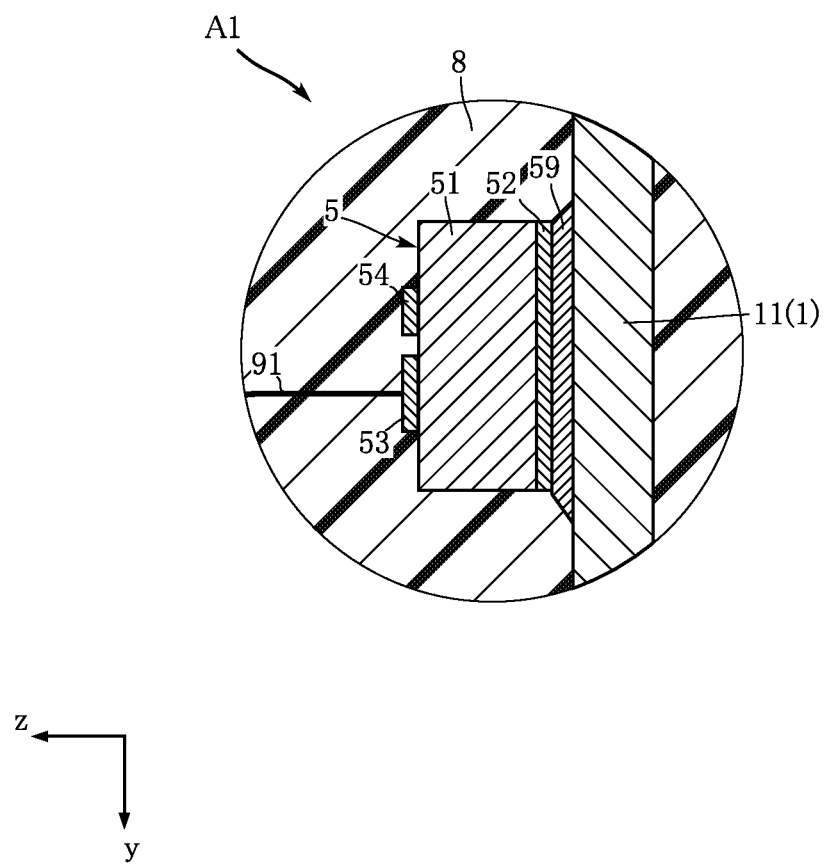
FIG. 12 is a main-part enlarged cross-sectional view showing the semiconductor device according to the first embodiment.
Figure 13:
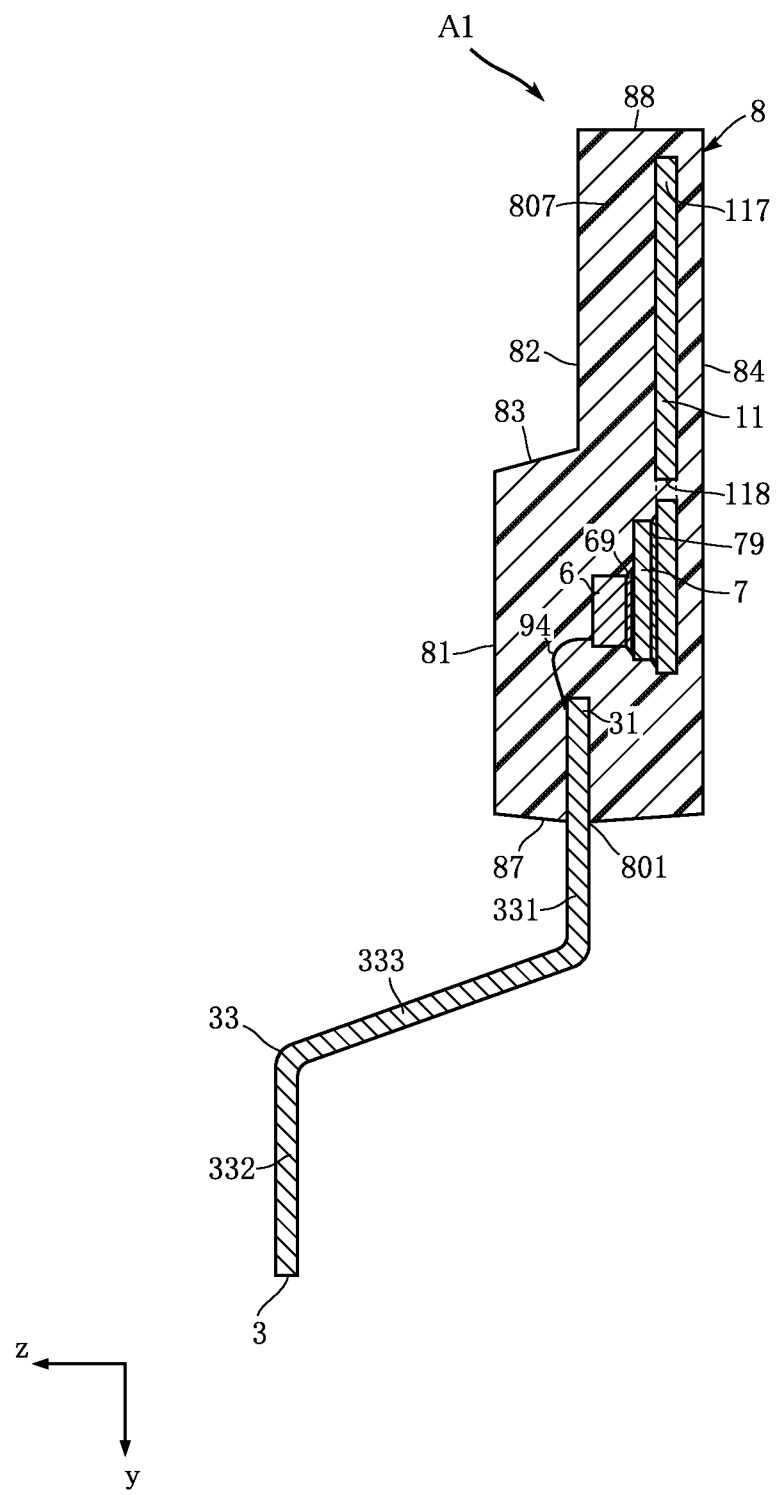
FIG. 13 is a cross-sectional view along line XIII-XIII of FIG. 8.
Figure 14:
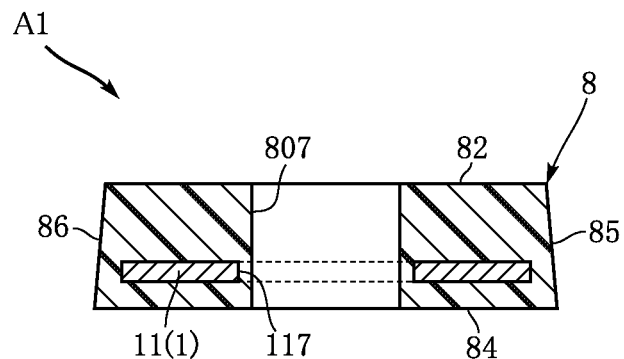
FIG. 14 is a cross-sectional view along line XIV-XIV of FIG. 2.
Figure 14:
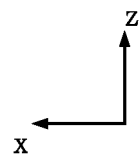
Figure 15:
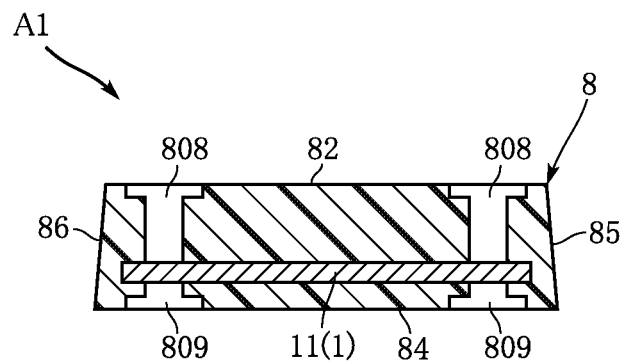
FIG. 15 is a cross-sectional view along line XV-XV of FIG. 2.
Figure 15:
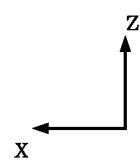

FIG. 1 is a perspective view showing the semiconductor device A1. FIG. 2 is a front view showing the semiconductor device A1. FIG. 3 is a plan view showing the semiconductor device A1. FIG. 4 is a bottom view showing the semiconductor device A1. FIG. 5 is a back view showing the semiconductor device A1. FIG. 6 is a left side view showing the semiconductor device A1. FIG. 7 is a right side view showing the semiconductor device A1. FIG. 8 is a main-part front view showing the semiconductor device A1. FIG. 9 is a main-part enlarged front view showing the semiconductor device A1. FIG. 10 is a cross-sectional view along line X-X of FIG. 8. FIG. 11 is a cross-sectional view along line XI-XI of FIG. 8. FIG. 12 is a main-part enlarged cross-sectional view showing the semiconductor device A1. FIG. 13 is a cross-sectional view along line XIII-XIII of FIG. 8. FIG. 14 is a cross-sectional view along line XIV-XIV of FIG. 2. FIG. 15 is a cross-sectional view along line XV-XV of FIG. 2. The x, y, and z directions in these figures respectively correspond to first, second, and third directions of the present disclosure.

The plurality of leads 1, 2, 3, and 4 support the switching element 5 and the control element 6, and also form conductive paths for operating the switching element 5 and the control element 6. In the present embodiment, the plurality of leads 1, 2, 3, and 4 include a drain lead 1, a source lead 2, one or more control leads 3, and a control lead 4. The plurality of leads 1, 2, 3, and 4 may be made of any suitable material. For example, it is possible to use a conductive material such as metal. For example, the plurality of leads 1, 2, 3, and 4 may be made of Cu, Fe, Ni, or an alloy of these metals. Also, in one example, plating layers may be provided in appropriate areas on the surfaces of the plurality of leads 1, 2, 3, and 4.

<Drain Lead 1>

The drain lead 1 has a die bonding portion 11, a connector portion 12, and a drain terminal 13. The die bonding portion 11 is where the switching element 5 and the control element 6 are die-bonded. The die bonding portion 11 is relatively large and has a flat plate-like shape that extends in the x direction and y direction. As shown in FIG. 8, in the present embodiment, the die bonding portion 11 has a main portion 111, a first extended portion 112, and a second extended portion 113.

The main portion 111 occupies most of the die bonding portion 11, and has a substantially rectangular shape in the illustrated example. In the illustrated example, the main portion 111 is formed with a through-hole 117 and a slit 118.

The through-hole 117 penetrates through the main portion 111 in the z direction. The through-hole 117 is not particularly limited in terms of shape, and has a circular shape in the illustrated example. The slit 118 is a groove or a through-slit having a predetermined shape. In the illustrated example, the slit 118 is a through-slit penetrating through the main portion 111 in the z direction. The slit 118 may have any shape.

The first extended portion 112 and the second extended portion 113 extend from the main portion 111 to a first side in the y direction. The second extended portion 113 extends from an area of the main portion 111 located on a first side in the x direction, and the first extended portion 112 extends from an area of the main portion 111 located on a second side in the x direction.

As shown in FIG. 9, the die bonding portion 11 includes a curved portion 114 and a bent portion 116. The curved portion 114 is located at the boundary between the main portion 111 and the second extended portion 113, and has a recessed curve shape as viewed in the z direction. The bent portion 116 is located at the boundary between the main portion 111 and the first extended portion 112, and is formed by two straight-line portions that are connected as viewed in the z direction.

The connector portion 12 connects the die bonding portion 11 and the drain terminal 13. In the illustrated example, the connector portion 12 is connected to the second extended portion 113 of the die bonding portion 11, and extends from the second extended portion 113 to the first side in the y direction. As shown in FIG. 10, the connector portion 12 is inclined so as to shift toward a first side in the z direction as it extends to the first side in the y direction.

The drain terminal 13, connected to the connector portion 12, extends from the connector portion 12 to the first side in the y direction, and protrudes from the resin member 8 to the first side in the y direction. In the present embodiment, the drain terminal 13 has a generally elongated shape in the y direction.

<Source Lead 2>

The source lead 2 is spaced apart from the connector portion 12 and the drain terminal 13 of the drain lead 1 on the second side in the x direction, and is also spaced apart from the main portion 111 of the drain lead 1 on the first side in the y direction. The source lead 2 has a wire bonding portion 21 and a source terminal 23.

The wire bonding portion 21 is where wires 91 and a wire 93 are bonded. As shown in the example of FIG. 9, the wire bonding portion 21 has a first extended portion 211 and a second extended portion 212. The first extended portion 211 extends to the second side in the x direction. The second extended portion 212 extends to the first side in the x direction. In the illustrated example, the second extended portion 212 is larger in size in the x direction than the first extended portion 211. As can be understood from FIGS. 10 and 11, the wire bonding portion 21 is shifted in position to the first side in the z direction relative to the die bonding portion 11. The position of the wire bonding portion 21 is substantially the same in the z direction as that of the drain terminal 13.

In the illustrated example, the wire bonding portion 21 includes a curved portion 213, a curved portion 214, a curved portion 215, and a corner portion 216. The curved portion 213 connects the edge of the first extended portion 211 on the second side in the x direction and the edge of the first extended portion 211 on the first side in the y direction, and has a protruded curve shape as viewed in the z direction. The curved portion 214 connects the edge of the second extended portion 212 on a second side in the y direction and the edge of the second extended portion 212 on the first side in the x direction, and has a protruded curve shape as viewed in the z direction. The curved portion 214 is provided to face the curved portion 114 of the drain lead 1 as viewed in the z direction. The curved portion 215 connects the edge of the second extended portion 212 on the first side in the y direction and the edge of the second extended portion 212 on the first side in the x direction, and has a protruded curve shape as viewed in the z direction.

The source terminal 23 protrudes from the resin member 8 to the first side in the y direction. In the present embodiment, the source terminal 23 includes a source proximal portion 231, a source distal portion 232, and a source connector portion 233, as shown in FIGS. 8 and 11. The source proximal portion 231 extends from the resin member 8 to the first side in the y direction. The source distal portion 232 is positioned on the first side in the y direction and on the first side in the z direction relative to the source proximal portion 231. The source distal portion 232 extends along the y direction. The source connector portion 233 connects the source proximal portion 231 and the source distal portion 232, and is inclined to the y direction and the z direction.

<Control Lead 3>

The control leads 3 are spaced apart from the source lead 2 on the second side in the x direction, and are also spaced apart from the main portion 111 of the drain lead 1 on the first side in the y direction. The number of control leads 3 is not particularly limited, and three control leads 3 are provided in the illustrated example. Three control leads 3 are arranged in the x direction at equal intervals. The control leads 3 are arranged on the opposite side from the drain lead 1 in the x direction with the source lead 2 therebetween. Each of the control leads 3 has a wire bonding portion 31 and a control terminal 33.

The wire bonding portion 31 is where a wire 94 is bonded. In the illustrated example, the wire bonding portion 31 may not have an exact rectangular shape, but include a portion or part extending toward the control element 6. As can be understood from FIGS. 10, 11, and 13, the wire bonding portion 31 is shifted in position to the first side in the z direction relative to the die bonding portion 11. The position of the wire bonding portion 31 is substantially the same in the z direction as those of the drain terminal 13 and the wire bonding portion 21.

The control terminal 33 protrudes from the resin member 8 to the first side in the y direction. In the present embodiment, the control terminal 33 includes a control proximal portion 331, a control distal portion 332, and a control connector portion 333. The control proximal portion 331 extends from the resin member 8 to the first side in the y direction. The control distal portion 332 is positioned on the first side in the y direction and on the first side in the z direction relative to the control proximal portion 331. The control distal portion 332 extends along the y direction. The control connector portion 333 connects the control proximal portion 331 and the control distal portion 332, and is inclined to the y direction and the z direction.

As shown in FIG. 4, in the present embodiment, the source distal portion 232 of the source lead 2 and the control distal portions 332 of the plurality of control leads 3 are located in a predetermined pattern, and may not be aligned along a single straight line, for example. In the illustrated example, a first group of the leads 2, 3 is offset in the z direction from the other (second) group of the leads, so that the leads of the first group and the second group have different heights (positions in the z direction). As shown in FIG. 4, the source distal portion 232 and the three control distal portions 332 may be arranged in a zigzag or staggering pattern as proceeding from one portion to the next portion in the x direction.

<Control Lead 4>

The control lead 4 is spaced apart from the control leads 3 on the second side in the x direction, and is also spaced apart from the main portion 111 of the drain lead 1 on the first side in the y direction. The number of control leads 4 is not particularly limited, and one control lead 4 is provided in the illustrated example. The control lead 4 is arranged on the opposite side from the source lead 2 in the x direction with the control leads 3 therebetween. The control lead 4 has a wire bonding portion 41 and a control terminal 43.

The wire bonding portion 41 is where a wire 94 is bonded. In the illustrated example, the wire bonding portion 41 has a portion or part extending toward the control element 6 as with the wire bonding portions 31 (though the directions of extension may be different depending on the respective portions). The wire bonding portion 41 is shifted in position to the first side in the z direction relative to the die bonding portion 11. The position of the wire bonding portion 41 is substantially the same in the z direction as those of the drain terminal 13, the wire bonding portion 21, and the wire bonding portions 31.

The control terminal 43 protrudes from the resin member 8 to the first side in the y direction. In the present embodiment, the control terminal 43 extends linearly from the resin member 8 to the first side in the y direction. As shown in FIG. 4, the position of the control terminal 43 is substantially the same in the z direction as that of the drain terminal 13.

<Switching Element 5>

The switching element 5 is not particularly limited as long as it switches on and off an input current. In the present embodiment, the switching element 5 is a SiC-MOSFET having a semiconductor layer that mainly contains SiC. The SiC-MOSFET has the advantage of low loss as compared to, for example, a Si-MOSFET having a semiconductor layer that mainly contains Si. In the present embodiment, the switching element 5 includes a semiconductor layer 51, a drain electrode 52, a source electrode 53, and a gate electrode 54, as shown in FIGS. 8, 9, 11, and 12.

The switching element 5 is mounted on the main portion 111 of the die bonding portion 11, specifically in an area that is on the first side in the y direction and that is substantially in the middle in the x direction. In addition, the switching element 5 is positioned further on the first side in the y direction relative to the slit 118. The semiconductor layer 51 mainly contains SiC. The drain electrode 52 is provided in an area of the semiconductor layer 51 that is on a second side in the z direction. In the present embodiment, the drain electrode 52 is electrically bonded to the main portion 111 with a conductive bonding material 59. The conductive bonding material is solder or Ag paste, for example. The source electrode 53 is provided in an area of the semiconductor layer 51 that is on the first side in the z direction. The gate electrode 54 is provided in an area of the semiconductor layer 51 that is on the first side in the z direction and that is positioned further on the second side in the y direction relative to the source electrode 53. The source electrode 53 is connected to the wire bonding portion 21 by the plurality of wires 91. The gate electrode 54 is connected to the control element 6 by a wire 92.

<Control Element 6>

The control element 6 is an integrated circuit element for controlling the switching operation of the switching element 5. The control element 6 includes a main body 61 and a plurality of electrode pads 62. The main body 61 is provided with an integrated circuit and has a rectangular shape as viewed in the z direction. The plurality of electrode pads 62 are provided in an area of the main body 61 on the first side in the z direction.

In the illustrated example, as shown in FIG. 8 or 9, the control element 6 is mounted on the drain lead 1 in a manner straddling the main portion 111 and the first extended portion 112 of the die bonding portion 11, though the present disclosure is not limited to this. The control element 6 is positioned on the second side in the x direction relative to the switching element 5. In the illustrated example, the control element 6 is also shifted toward the first side in the y direction relative to the switching element 5.

<Insulating Layer 7>

In the present embodiment, the insulating layer 7 is provided between the control element 6 and the die bonding portion 11. The insulating layer 7 can appropriately insulate the die bonding portion 11 and the control element 6 from each other that have the same potential as the drain electrode 52 of the switching element 5. The insulating layer 7 is made of an insulating material such as ceramics represented by alumina. As shown in FIG. 13, the insulating layer 7 is bonded to the die bonding portion 11 by a bonding material 79. The main body 61 of the control element 6 is bonded to the insulating layer 7 by a bonding material 69. In the present embodiment, the bonding material 79 and the bonding material 69 are insulating bonding material. However, another type of bonding material is also possible.

As shown in the example illustrated in FIG. 9, the edge of the insulating layer 7 on the second side in the y direction and the edge of the switching element 5 on the second side in the y direction are arranged at substantially the same position in the y direction.

The wire 93 and the plurality of wires 94 are appropriately connected to some of the electrode pads 62. The wire 93 is connected to one electrode pad 62 and the first extended portion 211 of the wire bonding portion 21. The plurality of wires 94 are individually connected to a plurality of electrode pads 62, the plurality of wire bonding portions 31, and the wire bonding portion 41.

<Resin Member 8>

The resin member 8 covers parts of the plurality of leads 1, 2, 3, and 4, the switching element 5, the control element 6, the insulating layer 7, and the wires 91, 92, 93, and 94.

The material of the resin member 8 is not particularly limited. For example, the resin member 8 may be made of a black epoxy resin mixed with a filler.

As shown in FIGS. 1 to 7, 10, 11, and FIGS. 13 to 15, the resin member 8 includes a first surface 81, a second surface 82, a third surface 83, a fourth surface 84, a fifth surface 85, a sixth surface 86, a seventh surface 87, and an eighth surface 88.

The first surface 81 faces the first side in the z direction. In the present embodiment, the first surface 81 is perpendicular to the z direction, and has a substantially rectangular shape as viewed in the z direction. The second surface 82 faces the first side in the z direction. In the present embodiment, the second surface 82 is perpendicular to the z direction, and has a substantially rectangular shape as viewed in the z direction. The second surface 82 is positioned further on the first side in the y direction and further on the second side in the z direction relative to the first surface 81. In the present embodiment, the first surface 81 overlaps with the switching element 5, the control element 6, the insulating layer 7, and the wires 91, 92, 93, and 94, as viewed in the z direction. On the other hand, the second surface 82 does not overlap with the switching element 5, the control element 6, the insulating layer 7, or the wires 91, 92, 93, and 94, as viewed in the z direction. The third surface 83 is positioned between the first surface 81 and the second surface 82, and is inclined to the y direction and the z direction.

The fourth surface 84 faces the second side in the z direction. In the present embodiment, the fourth surface 84 is perpendicular to the z direction, and has a substantially rectangular shape as viewed in the z direction.

The fifth surface 85 is positioned between a group of the first surface 81, the second surface 82, and the third surface 83, and the fourth surface 84 in the z direction. In the illustrated example, the fifth surface 85 is connected to the first surface 81, the second surface 82, the third surface 83, and the fourth surface 84. The fifth surface 85 faces the first side in the x direction. In the illustrated example, the fifth surface 85 is inclined by approximately 5° to the z direction. In other words, the fifth surface 85 is inclined toward the second side in the x direction as it extends to the first side in the z direction. The sixth surface 86 is positioned between the group of the first surface 81, the second surface 82, and the third surface 83, and the fourth surface 84 in the z direction. In the illustrated example, the sixth surface 86 is connected to the first surface 81, the second surface 82, the third surface 83, and the fourth surface 84. The sixth surface 86 faces the second side in the x direction. In the illustrated example, the sixth surface 86 is inclined by approximately 5° to the z direction. In other words, the sixth surface 86 is inclined toward the first side in the x direction as it extends to the first side in the z direction.

The seventh surface 87 is positioned between the first surface 81 and the fourth surface 84 in the z direction. In the illustrated example, the seventh surface 87 is connected to the first surface 81 and the fourth surface 84. The seventh surface 87 faces the first side in the y direction. In the illustrated example, the seventh surface 87 is made up of two inclined surfaces that are separated in the z direction. The eighth surface 88 is positioned between the second surface 82 and the fourth surface 84 in the z direction. In the illustrated example, the eighth surface 88 is connected to the second surface 82 and the fourth surface 84. The eighth surface 88 faces the second side in the y direction. In the illustrated example, the eighth surface 88 is substantially perpendicular to the y direction.

As shown in FIGS. 2, 5, 14, and 15, the resin member 8 in the present embodiment has a through-hole 807, recess portions 808, and recess portions 809. The through-hole 807 penetrates through the resin member 8 in the z direction, and is located within and surrounded by the through-hole 117 of the die bonding portion 11 of the drain lead 1 as viewed in the z direction. The recess portions 808 are recessed from the second surface 82. The recess portions 809 are recessed from the fourth surface 84. The recess portions 808 and the recess portions 809 are formed due to, for example, a process for supporting the drain lead 1 in the formation of the resin member 8.

As shown in FIGS. 1, 2, and 4 to 8, the resin member 8 includes a drain exposed portion 801, a source exposed portion 802, at least one control exposed portion 803, and a control exposed portion 804. The drain exposed portion 801 is a portion of the seventh surface 87 of the resin member 8, at which the drain terminal 13 of the drain lead 1 is exposed from the resin member 8. The source exposed portion 802 is a portion of the seventh surface 87 of the resin member 8, at which the source terminal 23 of the source lead 2 is exposed from the resin member 8. The control exposed portion 803 is a portion of the seventh surface 87 of the resin member 8, at which the control terminal 33 of the control lead 3 is exposed from the resin member 8. In the illustrated example, three control exposed portions 803 are provided, corresponding to the three control leads 3. The control exposed portion 804 is a portion of the seventh surface 87 of the resin member 8, at which the control terminal 43 of the control lead 4 is exposed from the resin member 8.

As shown in FIG. 4, the drain exposed portion 801, the source exposed portion 802, and the control exposed portions 803, and the control exposed portion 804 are aligned in the x direction. The control exposed portions 803 are arranged on the opposite side from the drain exposed portion 801 in the x direction with the source exposed portion 802 therebetween.

A distance dx1 between the drain exposed portion 801 and the source exposed portion 802 is larger than any of distances dx2, dx3, dx4, and dx5, each of which is a distance between adjacent ones of the source exposed portion 802, the control exposed portions 803, and the control exposed portion 804. Preferably, the distance dx1 is not smaller than twice and not larger than four times the distances dx2, dx3, dx4, and dx5.

The distance dz1 in the z direction between the drain terminal 13 and the source distal portion 232 is larger than the distance dx1 between the drain exposed portion 801 and the source exposed portion 802.

The distance d1 between the tip of the drain terminal 13 and the tip of the source distal portion 232 is larger than the distance between the tip of the source distal portion 232 and the tip of any of the control distal portions 332, and also larger than the distance between the tip of the source distal portion 232 and the tip of the control terminal 43. Further, the distances d2, d3, d4 and d5 between the tip of the drain terminal 13 and the tips of the control distal portions 332 or the control terminal 43 are larger than the distance d1.

The distance dz1 in the z direction between the drain exposed portion 801 and the source distal portion 232 is substantially the same as the distance dz1 in the z direction between the drain exposed portion 801 and one of the three control distal portions 332 that is located in the middle in the x direction. The distance dz2 in the z direction between the drain exposed portion 801 and a pair of control distal portions 332 that are included in the three control distal portions 332 and located on both sides in the x direction is larger than the distance dz1. The distance dz1 is larger than the distance in the z direction between any adjacent pair among the source distal portion 232 and the three control distal portions 332.

The distance d1 may preferably be not less than 0.5 times and not greater than 1.0 times the dimension W of the resin member 8 in the x direction.

In the illustrated example, the dimension W may be 10 mm. In this case, the distance d1 is not smaller than 5 mm and not larger than 10 mm, and may be approximately 7 mm. Furthermore, the distance dx1 may be approximately 3.2 mm, and the distances dx2, dx3, dx4, and dx5 may be approximately 1.2 mm. Also, the distance dz1 may be approximately 6.3 mm, and the distance dz2 may be approximately 7.6 mm.

Next, advantages of the semiconductor device A1 will be described.

According to the present embodiment, the distance dx1 between the drain exposed portion 801 and the source exposed portion 802 is larger than any of the distances dx2, dx3, dx4, and dx5, each of which is a distance between adjacent ones of the source exposed portion 802, the control exposed portions 803, and the control exposed portion 804, as shown in FIG. 4. This makes it possible to prevent an increase in the overall size of the semiconductor device A1 while appropriately insulating the drain lead 1 and the source lead 2 from each other that have a relatively large potential difference. Accordingly, the semiconductor device A1 can achieve high voltage operation and size reduction.

The distance dx1 being not smaller than twice and not larger than four times the distances dx2, dx3, dx4, and dx5 is preferable in achieving the high voltage operation and size reduction of the semiconductor device A1.

The distance d1 between the tip of the drain terminal 13 and the tip of the source distal portion 232 is not less than 0.5 times and not greater than 1.0 times the dimension W. As such, when the semiconductor device A1 is mounted on a circuit board (not shown), the bonding location of the drain terminal 13 of the drain lead 1 can be properly spaced away from the bonding location of the source distal portion 232 of the source lead 2. This makes it possible to maintain the semiconductor device A1 in small size and also to improve insulation at the circuit board, which is preferable in operation at high voltage.

The distance dz1 in the z direction between the drain terminal 13 and the source distal portion 232 is larger than the distance dx1 in the x direction between the drain exposed portion 801 and the source exposed portion 802. This makes it possible to separate the drain terminal 13 from the source distal portion 232 without unduly increasing the size of the semiconductor device A1 in the x direction. Also, the distances dz1 and dz2 between the drain terminal and the plurality of control distal portions 332 are larger than the distances between the drain exposed portion 801 and the control exposed portions 803. This is preferable in achieving the high voltage operation and size reduction of the semiconductor device A1.

The source distal portion 232 and the plurality of control distal portions 332 are arranged in a zigzag as viewed in the y direction. This makes it possible to keep a large distance between each adjacent pair among the source distal portion 232 and the plurality of control distal portions 332, without unduly separating the source exposed portion 802 from the control exposed portions 803. This is preferable in preventing solder or other bonding material (for bonding the source distal portion 232 and the plurality of control distal portion 332) from sticking to each other when the semiconductor device A1 is mounted on a circuit board or the like.

The control terminal 43 arranged on the opposite side from the drain terminal 13 in the x direction has a linear shape along the y direction. As such, the control terminal 43 as well as the drain terminal 13 is largely separated from the source distal portion 232 and the plurality of control distal portions 332 in the z direction. Accordingly, when the semiconductor device A1 is mounted on a circuit board, the resin member 8 together with the switching element 5, the control element 6, etc., housed therein can be stably supported by the drain terminal 13, the control terminal 43, the source distal portion 232, and the control distal portions 332.

As shown in FIGS. 8 and 9, the wire bonding portion 21 has the first extended portion 211 and the second extended portion 212. The second extended portion 212 extending to the first side in the x direction has a larger dimension in the x direction than the first extended portion 211 extending to the second side in the x direction. This makes it possible to increase the size of the wire bonding portion 21 at which the plurality of wires 91 are bonded, and to separate the source terminal 23 of the source lead 2 away from the drain terminal 13 of the drain lead 1 in the x direction. This is preferable for high voltage and/or large current operation.

Figure 16:
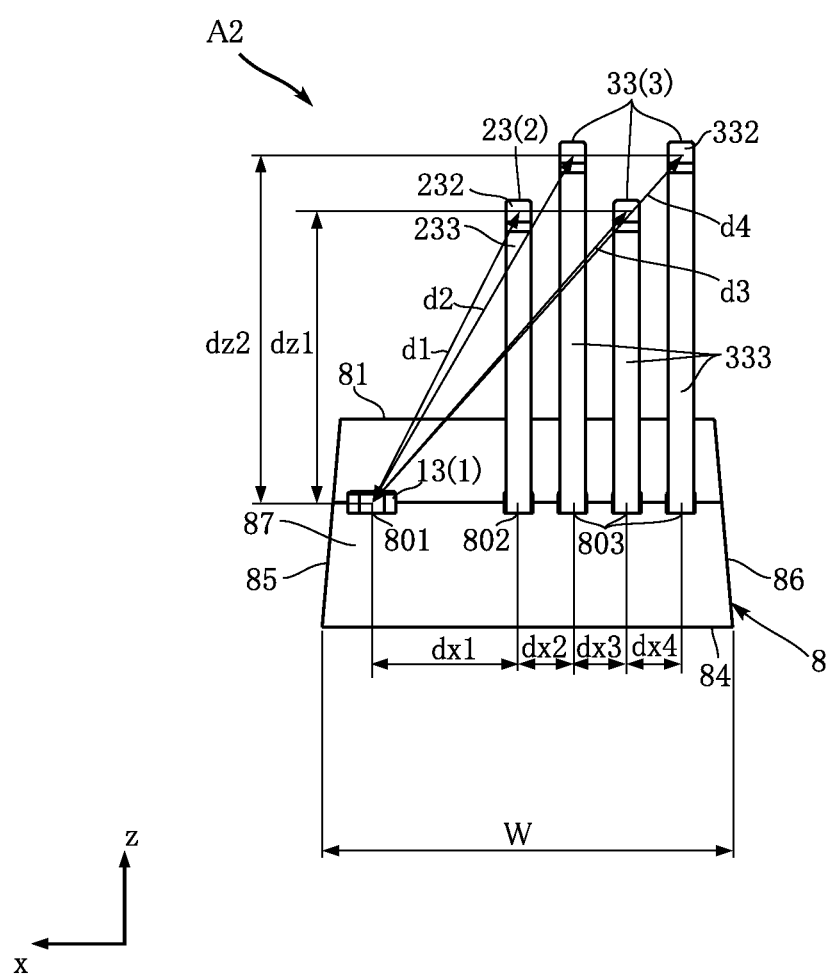
FIG. 16 is a bottom view showing a semiconductor device according to a second embodiment of the present disclosure.
Figure 17:
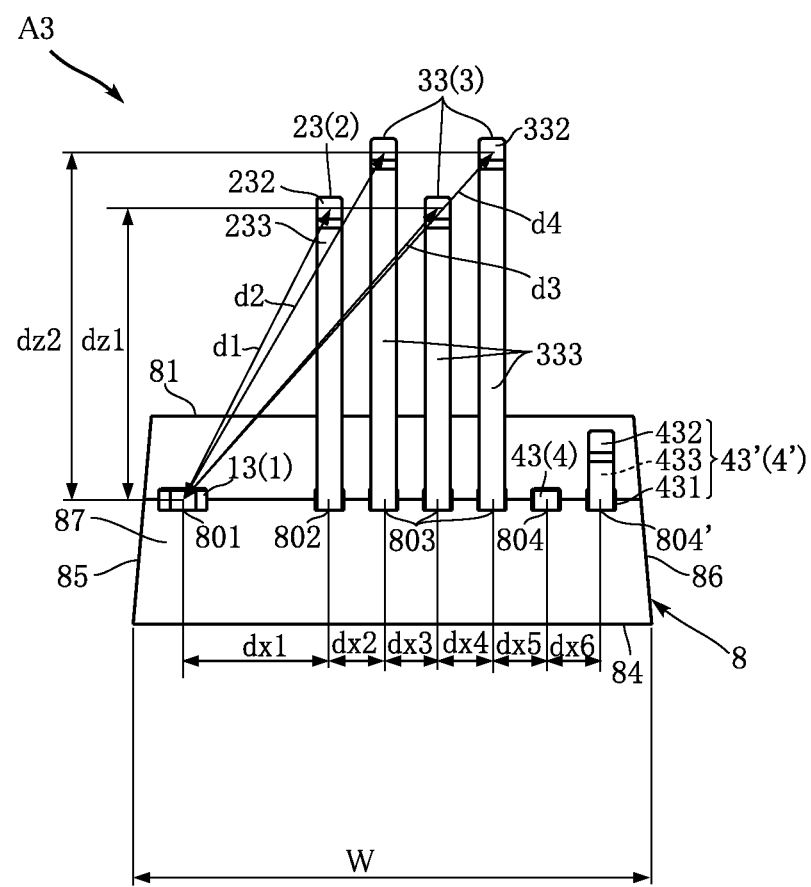
FIG. 17 is a bottom view showing a semiconductor device according to a third embodiment of the present disclosure.

FIGS. 16 and 17 show other embodiments of the present disclosure. In these figures, elements that are the same as or similar to those in the foregoing embodiment are provided with the same reference signs as in the foregoing embodiment.

Second Embodiment

FIG. 16 is a bottom view showing a semiconductor device according to a second embodiment of the present disclosure. A semiconductor device A2 of the present embodiment differs from the semiconductor device A1 in that the semiconductor device A2 does not include the control lead 4.

In the present embodiment, the control distal portions 332 of the plurality of control leads 3 are shifted in position to the first side in the z direction relative to the drain terminal 13, as with those in the semiconductor device A1. The arrangement is preferable in appropriately keeping the distances d2, d3, d4 between the plurality of control distal portions 332 and the drain terminal 13. As can be understood from the present embodiment, the present disclosure may provide a structure without the control lead 4 in the semiconductor device A1.

Third Embodiment

FIG. 17 is a bottom view showing a semiconductor device according to a third embodiment of the present disclosure. A semiconductor device A3 of the present embodiment includes a control lead 4' in addition to the drain lead 1, the source lead 2, the plurality of control leads 3, and the control lead 4.

The control lead 4' is arranged on the opposite side from the drain lead 1, the source lead 2, and the plurality of control leads 3 in the x direction with respect to the control lead 4. The control lead 4' is electrically connected to one of the plurality of electrode pads 62 of the control element 6.

The control lead 4' has a control terminal 43'. The control terminal 43' protrudes from the seventh surface 87 of the resin member 8 to the first side in the y direction. The control terminal 43' includes a control proximal portion 431, a control distal portion 432, and a control connector portion 433. The control proximal portion 431 extends from the resin member 8 to the first side in the y direction (like the proximal portion 231 in FIG. 1). The control distal portion 432 is positioned on the first side in the y direction and on the first side in the z direction relative to the control proximal portion 431, while also extending along the y direction (like the distal portion 232 in FIG. 1). The control connector portion 433 connects the control proximal portion 431 and the control distal portion 432, and is inclined to the y direction and the z direction (like the connector portion 233 in FIG. 1). The distance dx6 in the x direction between the control exposed portion 804 and a control exposed portion 804' (at which the control lead 4' is exposed from the resin member 8) may be substantially the same as the distance dx5.

The control distal portion 432 is positioned between the control terminal 43 of the control lead 4 and a group of the source distal portion 232 and the plurality of control distal portions 332 in the z direction. The control distal portion 432 is arranged closer to the control terminal 43 than the source distal portion 232 and the plurality of control distal portions 332 in the z direction. The distance between the control terminal 43 and the control distal portion 432 in the z direction may correspond to the difference between the distance dz1 and the distance dz2.

The present embodiment can also achieve the size reduction and high voltage operation of the semiconductor device A3. As can be understood from the present embodiment, the number of control leads 3, 4 and 4' are not particularly limited. Since the control terminal 43' of the control lead 4' is sufficiently separated from the drain terminal 13 in the x direction, the control terminal 43' does not need to be bent greatly in the z direction to keep a distance from the drain terminal 13. However, it is possible to shift, in the z direction, the control terminal 43 of the control lead 4 and the control terminal 43' that are adjacent to each other, so that when the semiconductor device A3 is mounted, solder or other bonding material for bonding the control terminal 43 and the control distal portion 432 can be prevented from undesirably adhering to the circuit board.

The semiconductor device according to the present disclosure is not limited to those in the foregoing embodiments. Various design changes can be made to the specific configurations of the elements in the semiconductor device according to the present disclosure.

The invention claimed is:

1. A semiconductor device comprising:
a plurality of leads;
a switching element having a drain electrode, a source electrode and a gate electrode;
a control element that controls the switching element; and
a resin member that covers the switching element, the control element and a part of each of the plurality of leads,
wherein the plurality of leads include a drain lead electrically connected to the drain electrode, a source lead electrically connected to the source electrode, and at least one control lead electrically connected to the control element,
the resin member includes: a drain exposed portion at which the drain lead is exposed from the resin member; a source exposed portion at which the source lead is exposed from the resin member; and a control exposed portion at which the control lead is exposed from the resin member,
a distance in a first direction between the drain exposed portion and the source exposed portion is larger than a distance in the first direction between the control exposed portion and the source exposed portion,
the drain lead has a drain terminal protruding from the resin member, and the source lead has a source terminal protruding from the resin member,
the drain terminal extends linearly along a second direction perpendicular to the first direction,
the source terminal includes a source proximal portion and a source distal portion, the source proximal portion extending from the source exposed portion along the second direction, the source distal portion extending along the second direction and being offset with respect to the source proximal portion in the second direction and in a third direction perpendicular to the first direction and the second direction.

2. The semiconductor device according to claim 1, wherein the drain exposed portion, the source exposed portion and the control exposed portion are aligned in the first direction.

3. The semiconductor device according to claim 2, wherein at least one control lead comprises a plurality of control leads, and the resin member comprises a plurality of control exposed portions corresponding to the plurality of control leads, respectively.

4. The semiconductor device according to claim 3, wherein the plurality of control exposed portions are opposite to the drain exposed portion with respect to the source exposed portion in the first direction.

5. The semiconductor device according to claim 4, wherein the plurality of control exposed portions includes a first control exposed portion closer to the source exposed portion than are the remaining ones of the control exposed portions,
the distance in the first direction between the drain exposed portion and the source exposed portion is not smaller than twice and not larger than four times a distance in the first direction between the source exposed portion and the first control exposed portion.

6. The semiconductor device of claim 4, wherein the plurality of control leads have respective control terminals protruding from the resin member.

7. The semiconductor device according to claim 6, wherein at least one of the plurality of control terminals includes a control proximal portion and a control distal portion, the control proximal portion extending from the resin member along the second direction, the control distal portion extending along the second direction and being offset with respect to the control proximal portion in the second direction and in the third direction.

8. The semiconductor device according to claim 7, wherein the at least one of the plurality of control terminals includes a control connector portion that connects the control proximal portion and the control distal portion to each other and that is inclined to the second direction and the third direction.

9. The semiconductor device according to claim 8, wherein a distance in the third direction between the drain terminal and the control distal portion is larger than a distance in the first direction between the drain exposed portion and one of the plurality of control exposed portions that corresponds to the at least one of the plurality of control terminals.

10. The semiconductor device according to claim 7, wherein the plurality of control terminals comprises: a first control terminal disposed next to the source terminal; and a second control terminal disposed next to the first control terminal, the first control terminal and the second control terminal including a first control distal portion and a second control distal portion, respectively, each extending along the second direction, the source distal portion and the first control distal portion are disposed at different positions in the third direction, and the first control distal portion and the second control distal portion are disposed at different positions in the third direction.

11. The semiconductor device according to claim 8, wherein the plurality of control terminals include a distal control terminal disposed farthest from the drain terminal in the first direction than are the remaining ones of the control terminals, and the distal control terminal extends linearly along the second direction.

12. The semiconductor device according to claim 1, wherein the source terminal includes a source connector portion that connects the source proximal portion and the source distal portion to each other and that is inclined to the second direction and the third direction.

13. The semiconductor device according to claim 12, wherein a distance in the third direction between the drain terminal and the source distal portion is larger than the distance in the first direction between the drain exposed portion and the source exposed portion.

14. The semiconductor device according to claim 1, wherein a distance between a tip of the drain terminal and a tip of the source terminal is not less than 0.5 times and not greater than 1.0 times a dimension of the resin member in the first direction.

15. The semiconductor device according to claim 14, wherein the distance between the tip of the drain terminal and the tip of the source terminal is not less than 5 mm and not greater than 10 mm.

16. The semiconductor device according to claim 1, wherein the switching element comprises a semiconductor layer that mainly contains SiC.

* * * * *